(12) United States Patent
Houben

(10) Patent No.: US 8,523,331 B2
(45) Date of Patent: Sep. 3, 2013

(54) MATERIAL JET SYSTEM

(75) Inventor: René Jos Houben, Nederweert (NL)

(73) Assignee: Nederlandse Organisatie voor togegepast-natuurwetenschappelijk Onderzoek TNO, Delft (NL)

( * ) Notice: Subject to any disclaimer, the term of this patent is extended or adjusted under 35 U.S.C. 154(b) by 917 days.

(21) Appl. No.: 12/159,521

(22) PCT Filed: Dec. 27, 2006

(86) PCT No.: PCT/NL2006/000669
§ 371 (c)(1),
(2), (4) Date: Nov. 20, 2008

(87) PCT Pub. No.: WO2007/075084
PCT Pub. Date: Jul. 5, 2007

(65) Prior Publication Data
US 2009/0219319 A1    Sep. 3, 2009

(30) Foreign Application Priority Data

Dec. 27, 2005  (EP) ..................................... 05078008

(51) Int. Cl.
*B41J 3/00* (2006.01)
*B05D 5/02* (2006.01)

(52) U.S. Cl.
USPC .................. 347/68; 347/69; 347/70; 347/99; 347/100; 118/300; 118/302; 118/663; 118/667; 118/694; 222/591; 222/593

(58) Field of Classification Search
USPC ........... 118/300, 302, 694, 663, 667; 228/33, 228/260, 262; 347/14, 26, 27, 88, 99; 222/591, 222/593; 164/423, 461, 463, 46, 271; 266/202, 266/236

See application file for complete search history.

(56) References Cited

U.S. PATENT DOCUMENTS

| | | | |
|---|---|---|---|
| 4,682,185 A | 7/1987 | Martner | |
| 5,171,360 A | 12/1992 | Orme et al. | |
| 5,598,200 A | * 1/1997 | Gore | .............................. 347/88 |

(Continued)

FOREIGN PATENT DOCUMENTS

| EP | 0 178 882 B1 | 8/1989 |
|---|---|---|
| EP | 0 338 590 A2 | 10/1989 |
| EP | 0 827 835 A2 | 3/1998 |
| EP | 1 552 941 A | 7/2005 |
| JP | 61-120761 A | 6/1986 |
| JP | 61-190011 A | 8/1986 |

(Continued)

OTHER PUBLICATIONS

International Search Report for PCT/NL2006/000669 dated May 11, 2007.

*Primary Examiner* — Laura Edwards
(74) *Attorney, Agent, or Firm* — Leydig, Voit & Mayer, Ltd.

(57) ABSTRACT

A material jet system, comprising a container for molten jet material (3) to be ejected, a heater (4) for melting and/or keeping molten said jet material, and a jetting unit (5, 6, 7) which is arranged to form and eject droplets (8) of said jet material. The system, moreover, comprises supply structures (2) which are arranged for providing an uninterrupted supply of said material, which comprises a metal in solid form (1), and which preferably have the shape of a wire, bar or tape. Furthermore the system comprises a structure for sealing the material in solid form and a pressure controller to control a heat insulating fluid pressure in the container.

9 Claims, 3 Drawing Sheets

(56) References Cited

U.S. PATENT DOCUMENTS

| | | | |
|---|---|---|---|
| 5,894,980 A * | 4/1999 | Orme-Marmarelis et al. | 228/33 |
| 6,401,001 B1 | 6/2002 | Jang et al. | |
| 6,409,327 B1 | 6/2002 | Koeleman et al. | |
| 6,422,694 B1 | 7/2002 | Hollands | |
| 6,491,737 B2 * | 12/2002 | Orme-Marmerelis et al. | 75/335 |
| 6,902,243 B2 * | 6/2005 | Bober | 312/306 |
| 7,122,816 B2 * | 10/2006 | Algots et al. | 250/504 R |
| 2004/0017408 A1 | 1/2004 | Cok | |
| 2004/0239730 A1 | 12/2004 | Kurosawa | |

FOREIGN PATENT DOCUMENTS

| | | |
|---|---|---|
| JP | 63-28653 A | 2/1988 |
| JP | 63-095670 A | 4/1988 |
| JP | 08-024757 | 1/1996 |
| JP | 11-263026 A | 9/1999 |
| JP | 2000-294591 A | 10/2000 |
| JP | 2004-249572 A | 9/2004 |
| JP | 2005-504653 A | 2/2005 |
| JP | 2008-532228 A | 8/2008 |
| WO | WO 97/09142 A | 3/1997 |

* cited by examiner

MATERIAL JET SYSTEM

FIELD

The invention concerns "hot-melt" jet systems, especially arranged for deposition of materials with a relative high melting temperature.

BACKGROUND

Material jet systems (often called "inkjet systems) may work with materials which are supplied to the printer head in their fluid phase. However, in so-called "hot melt" systems, e.g. using wax-like materials, the printing material only becomes fluid at increased temperature, and thus has to be processed by a heated jet printer head. However, regular and controlled supply of solid "ink" (material, in general) may be a problem. A heated supply system may be used, in which the ink is heated and kept above its melting temperature in a rather large storage container and supplied—in molten form—to the printer head. In this way a large part of the device has to be kept above melting temperature. A known alternative is to use a heated reservoir at the printer head that is filled up now and then by addition of a piece of solid ink. A disadvantage of this type of system is that a considerable quantity of ink must be kept at temperature in the neighbourhood of the printer head.

Conventional printing of solid ink materials is known, for example, from EP1552941 which discloses a printer having a solid ink stick feed. However, these printers function at temperatures which are not suitable for printing solid materials which have higher melting temperatures like lead, tin, copper, silver etc., the system has to be heated in that way that in practice this not only becomes very complicated, but in view of the reactivity of metals in fluid phase, even almost impossible.

U.S. Pat. No. 4,682,185 discloses a printing system having a flexible web of hot melt ink, to be incrementally advanced to a heater location to prevent deterioration of the ink. However for molten metals, a desire exists to further minimize the heat load of the jet system.

SUMMARY

The aim of the invention is to present advanced solid material supply to a hot melt type material jet system. To that end the new material jet system presented here, comprises a container for molten jet material to be ejected, heating means for melting and/or keeping molten said jet material, and jetting means which are arranged to form and jet out droplets (particles) of said jet material, and, moreover, means which are arranged to uninterruptedly supply said material in solid form. According to an aspect of the invention, the supply means are arranged to supply a metal in solid form; said system further comprising a sealing means for sealing the material in solid form; and a pressure control means to control a heat insulating fluid pressure in said container. Preferably, said material in solid form has the shape of a wire, bar or tape.

If the material is supplied in a way of e.g. a wire (or bar or tape), the solid material can be supplied relatively simple (and controlled). As the material thus can be supplied continuously, without interrupting the print process, it becomes possible to reduce the molten material quantity to a minimum. Where comparable techniques already have molten quantities material in the order of 20-50 cc, here, due to the sealed environment, which prevents outflow of low viscosity metals, in particular, for a printing head which is provided on a lower side of the system, seen in the direction of gravity, a fraction of that will do for (order of 1 cc). This substantial reduction of the quantity of molten material will make it much more simple to reach the high temperatures required for melting of metals etc, as only a small part of the printer head needs to be resistant against the aggressiveness of this kind of materials.

The molten jet material must be under a controlled pressure by a heat insulating fluid, for example an (inert) gas, to make possible the jetting by means of a print process. With the known "Drop On Demand" (DOD) principle the material must just not stream out of the nozzle, to keep an equilibrium as critical as possible, so that a drop can be shot with a low pressure pulse. With another principle, known as the "Continuous Ink Jet" (CIJ) principle a supply pressure has to be supplied to eject the material to form droplets. So it will be important to control the pressure in the jet material chamber and thus to provide the wire feed with sealing means. According to the invention, the material jet system may be applied as a continuous feed system, wherein a continuous jet of drops is provided; or as a drop on demand systems; wherein only selectively drops are provided.

By keeping the wire feed input at a distance from the (small) heated volume it will be possible to realize this with normal sealing methods, e.g. using O-rings. The jetting means, which may comprise a piezo-electric vibration element to cause the drops to be jetted, can thus be kept at a certain distance. By causing the vibration via e.g. a ceramic pin, the piëzo element can be isolated thermally from the heated volume. The use of ceramic materials as a vibration conductor and possibly as printer head material makes it possible, e.g. by means of induction heating, to heat the jet material only.

EXEMPLARY EMBODIMENT

Figure 1:
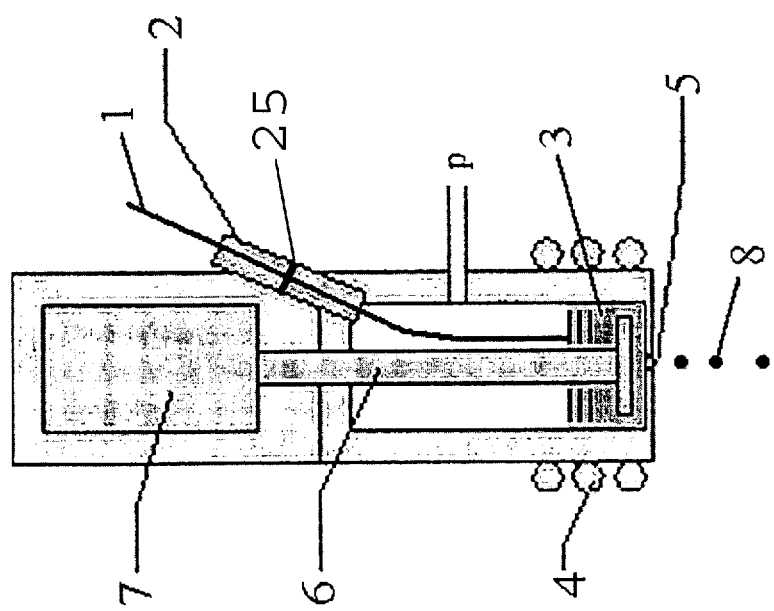
FIG. 1 shows schematically an exemplary embodiment of the present invention.

The exemplary embodiment of FIG. 1 shows a material jet system, comprising a container for molten jet material 3 to be ejected, high frequency induction heating means 4 arranged for electric heating and thus melting (and keeping molten) said jet material. Moreover the embodiment comprises jetting means which comprise a jet nozzle 5, a vibration conductor 6 and a vibration actuator 7, all arranged to form and eject (jet)—via jet nozzle 5—material droplets (particles) 8 e.g. for building a micro-sized component (not shown). The system, moreover, comprises means 2 which are arranged for an uninterrupted supply of said material, e.g. a metal, in solid form, preferably having the shape of a wire 1, bar or tape.

Figure 2B:
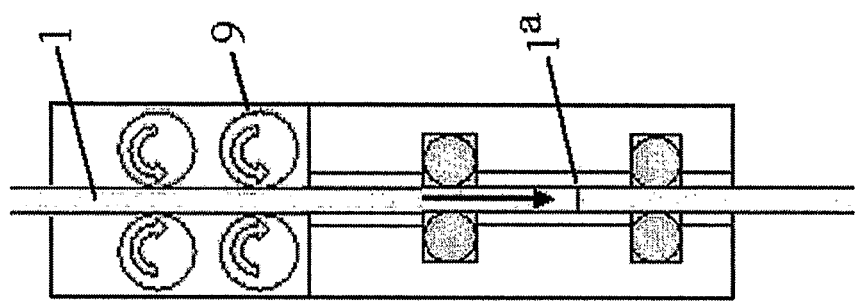
FIG. 2 shows a detail of the same embodiment.
Figure 2A:
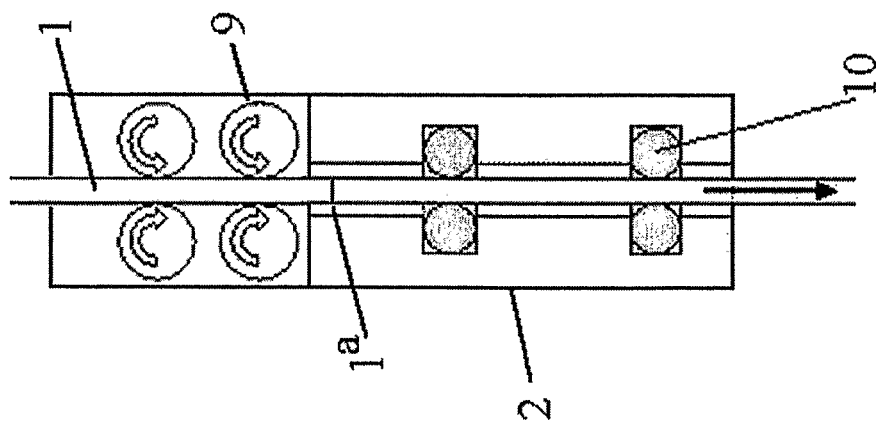
Figure 3:
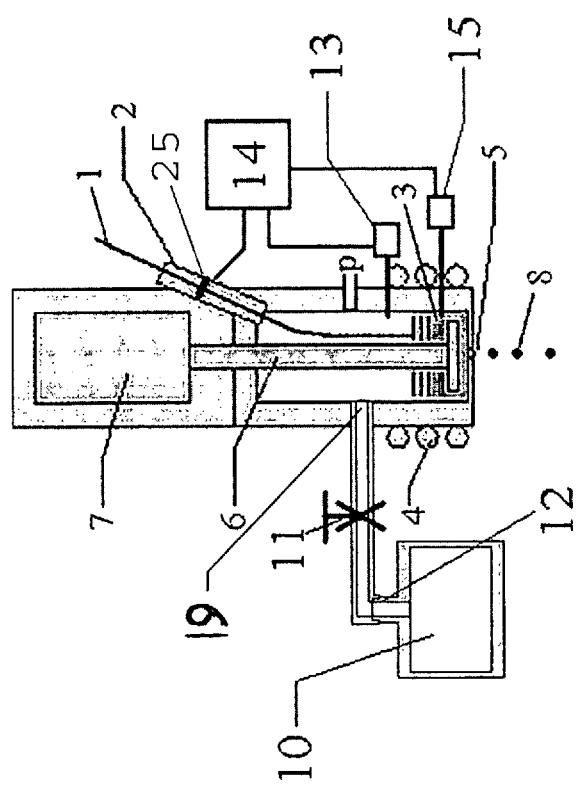
FIG. 3 shows a more extended embodiment of the invention.

As FIG. 2 shows more in detail the wire 1 may be fed towards the container 3 by means of a couple of drive "wheels" 9 which are controllable by control means 14 (FIG. 3). To maintain an adequate pressure in the container 3 heat insulating fluid 20 is pressure controlled and contained in the container 3, e.g. a source of inert gas under pressure indicated in FIGS. 1 and 3 by "p", the wire 1 may be sealed by means of a couple of e.g. rubber O-rings 25.

A disadvantage of supplying the material in this way is the fact that the material cannot be filtered before, causing that contaminations may introduced into the system. When use is made of metals as "ink" this is not a real problem because in that case all contaminations (e.g. oxides) will float to the surface. When the system is heavily used of when relatively contaminated material is used the system, however, may become contaminated and unusable in short time.

A solution for this problem may be found—shown in FIG. 3—by using an overflow outlet 19. When the system has to be cleaned—e.g. once in a certain period of use—more (solid) material is supplied than normally, causing that the floating contamination runs over in a waste reservoir 10. Next, this reservoir can be emptied. When using a separation valve 11 the system's jetting operation does not need to be interrupted when detaching the reservoir 10. Due to valve 11 (temporarily closed) the system pressure within the molten material container will be maintained. However, a well-functioning valve at high temperatures is not that simple. Without using valve 11, the waste reservoir 10 could be unscrewed (12) and emptied. In that case, however, the printing process has to be interrupted temporarily.

It may be preferred to monitor the (maximum) level of the molten jet material by means of a level sensor 13, enabling— together with control means 14 and the wire feeding means 2—that never too much material will be entered into the system. However, during the (periodical) cleaning process— discussed before—during which the supply of solid material is increased temporarily, the input of level sensor 13 will have to be temporarily disabled, as result of which the molten material level is admitted then to rise above the level of the overflow outlet 9 and thus causing that the floating contamination runs over in the waste reservoir 10.

Besides, a second level sensor 15 may be used to prevent, together with the control means 14, that the molten material level becomes too low, which could result in the molten material container to "run dry" and become overheated and/or material contaminations to block the nozzle 5. In that case the control means 14 will order the feeding means 2 to increase the solid material supply speed.

The invention claimed is:

1. A material jet system, comprising:
    a container for molten jet material to be ejected;
    a heater for melting and/or keeping molten said jet material;
    a jetting unit which is arranged to form and jet droplets of said jet material;
    a supply unit which is arranged for providing an uninterrupted supply of said jet material, said jet material comprising a metal in solid form, said supply unit including a driver under control of a controller for feeding said metal in solid form towards said container;
    a sealing member for sealing the material in solid form, the sealing member being disposed to function as a seal between the supply unit and the metal in solid form as the driver feeds the metal in solid form towards the container for providing a sealed environment downstream of said sealing member for keeping the molten jet material including a heat insulating fluid, added to the container, under controlled pressure while providing said material in solid form; and
    a pressure control system comprising a source of said heat insulating fluid to control pressure in said container.

2. The material jet system according to claim 1, wherein said driver is arranged for feeding said metal in solid form having a shape of one or more of: a wire, bar or tape.

3. The material jet system according to claim 1, wherein the heat insulating fluid comprises an inert gas, and wherein said source comprises an inert gas supply.

4. The material jet system according to claim 1, the container for molten jet material comprising an overflow outlet which is arranged to provide that contaminations floating upon molten jet material run over in a waste reservoir.

5. The material jet system according to claim 4, the controller being arranged to temporarily increase a supply rate of said driver t, in order to remove contaminations floating upon the molten jet material by causing the floating contaminations to run over in the waste reservoir.

6. The material jet system according to claim 4, further comprising a level sensor for monitoring a level of molten jet material, the system being arranged to disable the level sensor to enable the controller to control said driver such that the contaminations floating upon the molten jet material are removable periodically by enabling periodic increasing of the supply of the material in solid form for some time.

7. The material jet system according to claim 4, the waste reservoir being detachable, and the system comprising a valve between the overflow outlet and the detachable waste reservoir, which valve can be closed when detaching the waste reservoir.

8. The material jet system according to claim 1, further comprising a monitoring unit arranged for monitoring the surface level of the molten jet material, the controller being arranged to provide that the supply of the material in solid form is decreased as long as the surface level of the molten jet material is above a maximum level.

9. The material jet system according to claim 1, further comprising a monitoring unit arranged for monitoring the surface level of the molten jet material, the controller being arranged to provide that the supply of the material in solid form is increased as long as the surface level of the molten jet material is below a minimum level.

* * * * *

UNITED STATES PATENT AND TRADEMARK OFFICE
CERTIFICATE OF CORRECTION

| | | |
|---|---|---|
| PATENT NO. | : 8,523,331 B2 | Page 1 of 1 |
| APPLICATION NO. | : 12/159521 | |
| DATED | : September 3, 2013 | |
| INVENTOR(S) | : René Jos Houben | |

It is certified that error appears in the above-identified patent and that said Letters Patent is hereby corrected as shown below:

Title page

Item (73) Assignee:

"Nederlandse Organisatie voor togegepast-natuurwetenschappelijk Onderzoek TNO"

should be:

--Nederlandse Organisatie voor toegepast-natuurwetenschappelijk Onderzoek TNO--

Signed and Sealed this
Twenty-second Day of October, 2013

Teresa Stanek Rea
*Deputy Director of the United States Patent and Trademark Office*

UNITED STATES PATENT AND TRADEMARK OFFICE
CERTIFICATE OF CORRECTION

PATENT NO.       : 8,523,331 B2
APPLICATION NO.  : 12/159521
DATED            : September 3, 2013
INVENTOR(S)      : René Jos Houben It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1117 days.

Signed and Sealed this

Fifteenth Day of September, 2015

Michelle K. Lee
*Director of the United States Patent and Trademark Office*